United States Patent [19]

Miller, Jr. et al.

[11] Patent Number: 4,514,690
[45] Date of Patent: Apr. 30, 1985

[54] POWER LINE FIELD INTERFERENCE REJECTION FOR MAGNETIC SENSORS

[75] Inventors: Walter E. Miller, Jr.; James W. McKelvy, both of Huntsville, Ala.

[73] Assignee: The United States of America as represented by the Secretary of the Army, Washington, D.C.

[21] Appl. No.: 303,453

[22] Filed: Sep. 18, 1981

[51] Int. Cl.³ .................. G01R 33/00; H03K 5/00
[52] U.S. Cl. .................. 324/225; 324/207; 307/520; 328/166
[58] Field of Search .............. 324/179, 207, 208, 225, 324/241–243; 375/100, 102; 328/167, 166, 165; 307/234, 520

[56] References Cited

U.S. PATENT DOCUMENTS

| | | | |
|---|---|---|---|
| 3,281,593 | 10/1966 | Mendelsohn | 324/179 |
| 3,573,441 | 4/1971 | Glazay | 324/179 |
| 4,317,077 | 2/1982 | Zwarts | 324/179 |

Primary Examiner—Gerard R. Strecker
Assistant Examiner—Walter E. Snow
Attorney, Agent, or Firm—Anthony T. Lane; Robert P. Gibson; Robert C. Sims

[57] ABSTRACT

The discriminator consists of two major parts; a nonlinear filter for low level rejection, and inhibiting logic for high level rejection, of ac magnetic fields. The nonlinear filter approximately halves the frequency characteristics of a particular class of signals, while at the same time doubling the frequency of normal interfering signals. The inhibiting logic uses the known in-phase relationship to sense and reject even very large time dependent interference. However, spatially variant signals observed from near field relative motion of two orthogonal magnetic sensors with respect to a ferro-magnetic object have a near quadrature relationship that permits signal recognition even when of less amplitude than the interference.

5 Claims, 12 Drawing Figures

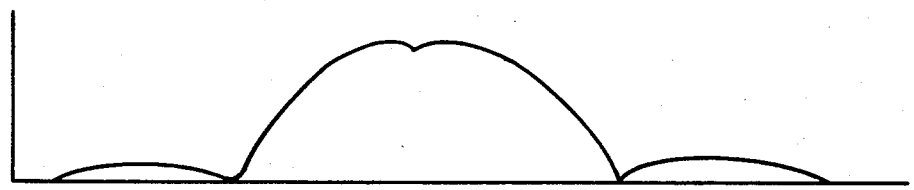
FIG. 5
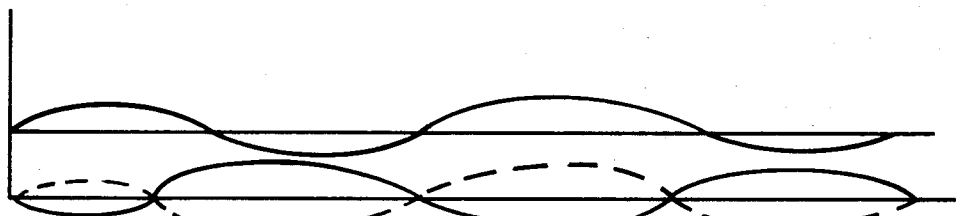
FIG. 6 — POSSIBLE ALTERNATE PHASE RELATIONSHIP
FIG. 7
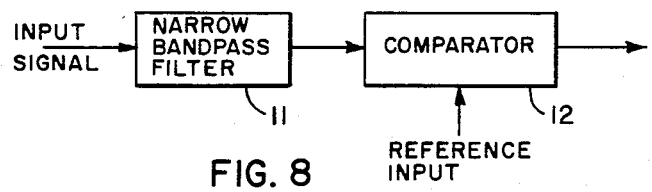
FIG. 8
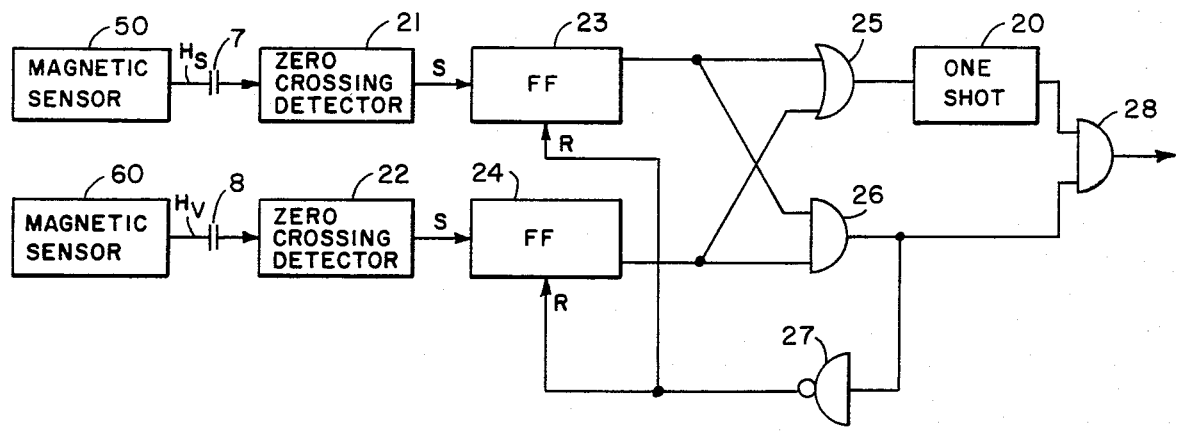
FIG. 9

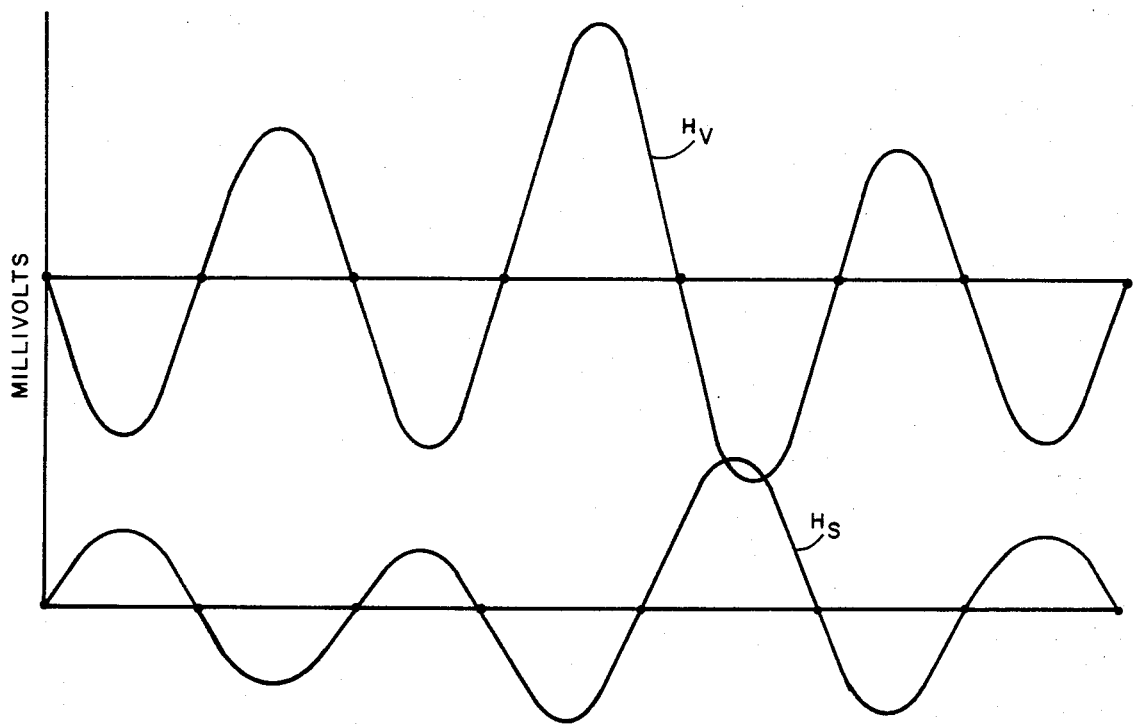
FIG. 10
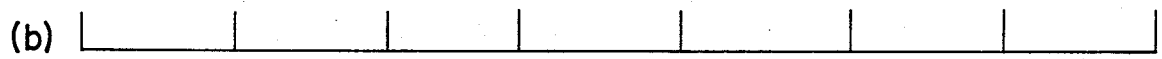
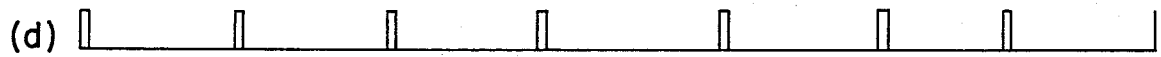
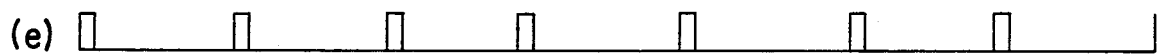
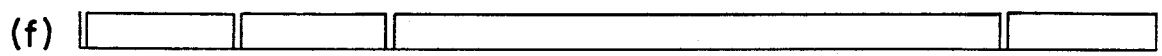
| SIGNAL CLEARED (POWER LINE) | SIGNAL PERMITTED EVEN IN PRESENCE OF POWER LINE | SIGNAL CLEARED |
FIG. 12

POWER LINE FIELD INTERFERENCE REJECTION FOR MAGNETIC SENSORS

DEDICATORY CLAUSE

The invention described herein may be manufactured, used, and licensed by or for the Government for governmental purposes without the payment to us of any royalties thereon.

SUMMARY OF THE INVENTION

The discriminator requires that the desired signal consist of two components approximately in quadrature. An ideal example would be sine and cosine bursts. Full wave rectification and summing produces a lower frequency content for such signals. An interfering source which produces inphase interference on both components of the quadrature signal, however, is increased in frequency content, producing an increase in the frequency separation from desired signals. The sensor can be a magnetic type on a missile. When it passes power lines, jamming devices, etc, the false signals occur.

The rejection logic first detects the zero crossing times at the two inputs. Coincidence or near coincidence indicates a time dependent signal such as ac power interference and provides an inhibit function for large amplitude interference. If time between zero crossings of the two inputs exceeds some selectable value, mechanisms other than time variation of a field are in effect, and the inhibit function is not activated. By making this time selection sufficiently narrow, a small "target" (moving ferro-magnetic object such as a tank) may be detected even in the presence of large interference.

BRIEF DESCRIPTION OF THE DRAWINGS

FIG. 5 illustrates a processed magnetic signal;

FIG. 6 illustrates a typical interference signal;

FIG. 7 illustrates a processed interference signal;

FIG. 8 illustrates an interference detector;

FIG. 9 illustrates an interference detector illustrating a principle of the present invention;

FIG. 10 shows the combined signal plus interference which can be presented to the circuit of FIG. 9;

FIG. 12 is an illustration of the signal outputs at the various points of the circuit of FIG. 11.

DESCRIPTION OF THE BEST MODE AND PREFERRED EMBODIMENTS

Figure 1:
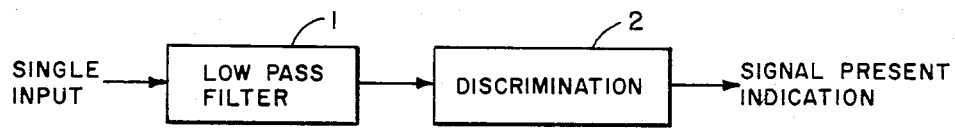
FIG. 1 illustrates simple single input processing.

A conventional simple low pass filter 1 shown in FIG. 1 is often used to reject unwanted frequencies prior to a signal discrimination device 2 such as a threshold crossing circuit.

Figure 2:
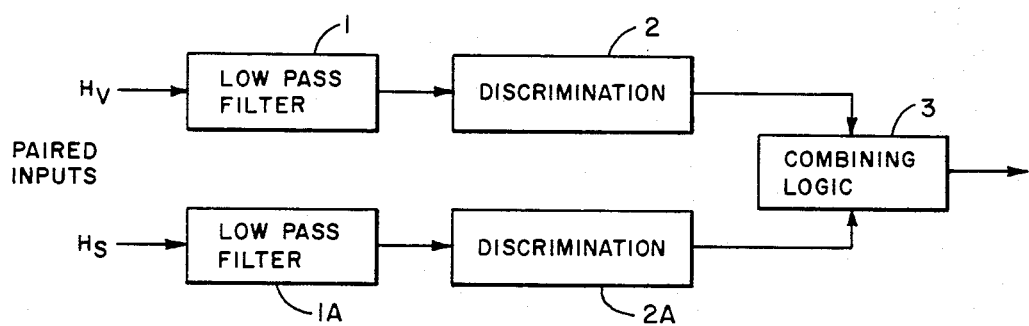
FIG. 2 illustrates pair input processing.

FIG. 2 shows a common method of processing related or paired input signals, consisting of separate processing as in FIG. 1 plus combining logic. Simple combinational logic 3 alternative are "AND" and "OR" circuits.

Figure 3:
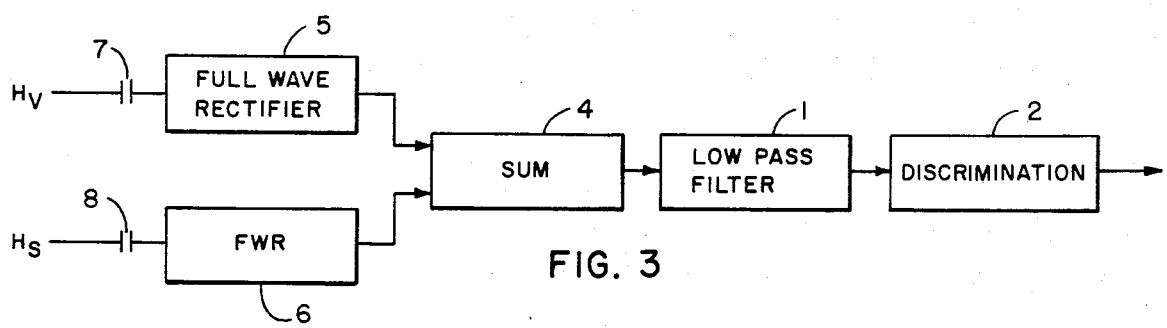
FIG. 3 illustrates the use of a non-linear filter for processing.

FIG. 3 shows a functional diagram of the improved non-linear filter which forms the first part of this method. The filter is similar to an AM demodulator, but utilizes two signals $H_p$ and $H_s$ in near quadrature to "fill in" the envelope at the summer 4. Capacitors 7 and 8 remove the dc component of the signal in FIG. 4. The full wave rectifiers 5 and 6 double the frequency of interferring sine waves (FIG. 6), making the rejection easier for low pass filter 1. A comparator then serves as a discriminator 2, to output a voltage wherever the quadrature signals are present above a level determined by the comparator threshold.

Figure 4:
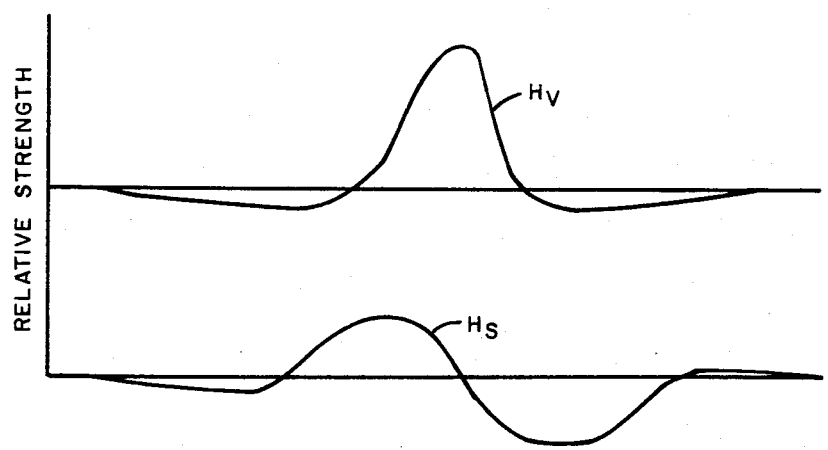
FIG. 4 illustrates the typical signals detected by a magnetic sensor.

FIG. 4 shows an example of near quadrature signals suitable for the processing method of this invention. These two signals ($H_p$ and $H_s$) result from two perpendicular magnetic sensors in a particular orientation in the earth's magnetic field when disturbed as a ferrous object passes near the sensors. Any of the well known magnetic sensors may be used. (The equations for such a field are given in Paris and Hurd "Basic Electromagnetic Theory," McGraw-Hill, 1969, page 246.)

FIG. 5 illustrates the result of ac coupling, full wave rectification, and summation of these signals. The fine structure of this waveform is a function of sensor/target/earth's field geometry and, so, is unimportant to the detection of signal presence. The lower frequency content of this waveform is obvious by comparison to either of the input waveforms of FIG. 4.

FIG. 6 shows a time variant (ac) magnetic field interference such as could be caused by a 60 Hz ac power line near the orthogonal sensors. The relative strength of the two signals is dependent on the geometry of the two magnetic field sensors relative to the ac current line(s). However, their relative phase is always 0° or 180° at any location and orientation; the ac magnetic field passes through zero when the line current is zero. This in-phase relationship produces a frequency doubling of this type interference (when rectified and summed in the same manner as the signal of FIGS. 4 and 5) as shown in FIG. 7.

For those cases where the signal pair (FIG. 4) frequency content is predominately below that of interference (FIG. 6) and also possesses the "near quadrature" characteristics of FIG. 4, while the interference does not, the method described will approximately half the signal frequency content and double the frequency of interference. This will provide greater frequency separation between desired signal and undesired interference and enhance discrimination by a conventional low pass filter. In many applications, the dc component produced by the rectifiers could be ignored, permitting a bandpass rather than low pass filter and providing further signal/interference selectivity.

FIG. 8 shows a simple circuit that could be used to detect the presence of interference based on amplitude of a known frequency interfering source (such as 60 Hz power). The signal is fed through filter 11 to comparator 12 which has the reference input to it for selection of detection level. This approach obviously does not permit signal acquisition under conditions when both signal and interference are present.

FIG. 9 shows a block diagram of a unique logic function which permits detection of interference (in-phase signals) but does not detect even very large near-quadrature signals. Further, it is capable (by adjustment of the one-shot 20 timing period of ignoring interference when a signal is also present, based on the zero crossing delays that result from the sum of in-phase (interference) and out-of-phase (quadrature signal) inputs.

The signals of FIG. 4, if applied to the inputs of FIG. 9 by two perpendicular magnetic sensors 50 and 60 would produce the following effect: (1) the first signal to cross zero (ac coupled) as detected by detectors 21 and 22 would set one flip-flop 23 or 24 and thus trigger the one-shot 20 through OR gate 25; (2) the second signal would cross zero at a substantially different time, i.e., after the one-shot had timed out, and again trigger the one-shot. No output from AND gate 28 would be generated, as one shot 20 would time out before AND gate 26 produced an enable for AND gate 28. AND gate 26 produces a low at the output of NAND gate 27, which acts as a very short delay and an inverter. The low ouput from NAND gate 27 is applied to the reset input of both flip flops (23 and 24), clearing them within a very short time of the setting of the "second" flip flop. The interference (FIG. 6) would produce near simultaneous setting of both flip-flops as the signals go through zero at the same time in absence of the quadrature signal. The first flip-flop activated will trigger the one shot. Propagation delays through AND gate 26 and NAND gate 27 forming the feed back loop permit the reset to always occur with sufficient delay (10 to 100 nanoseconds) to ensure both the one-shot firing and the output "AND" function 28, even with perfectly simultaneous triggering of the two flip-flops. The output of AND gate 28 is a narrow pulse whose width is the delay time (10 to 100 nanoseconds), and occurs only if the input zero crossings (21 and 22) are closer together than the one shot (20) pulse width. The one-shot pulse width then determines the time difference (between zero crossings) and thus provides the selection between in-phase (interference) and out-of-phase (Signal) events. If the time difference between zero crossing is less than the pulse width of 20 then 28 gives a pulse output. It it is greater than there is no output from AND gate 28.

FIG. 10 shows the sum of the signal (FIG. 4) and strong interference (FIG. 6) as might occur when a "target" is present, during time interference is also present. The interference (such as power lines or jamming) is shown at a slightly higher frequency than the signal. The zero crossings after ac coupling are indicated. Note that even a small affects the zero crossings of the two input waveforms differently, causing a time difference that would be detectable (by the one-shot of FIG. 9 timing out). Thus, the interference detector will treat signal plus interference as signal and present no output from gate 28; an ideal result.

Figure 11:
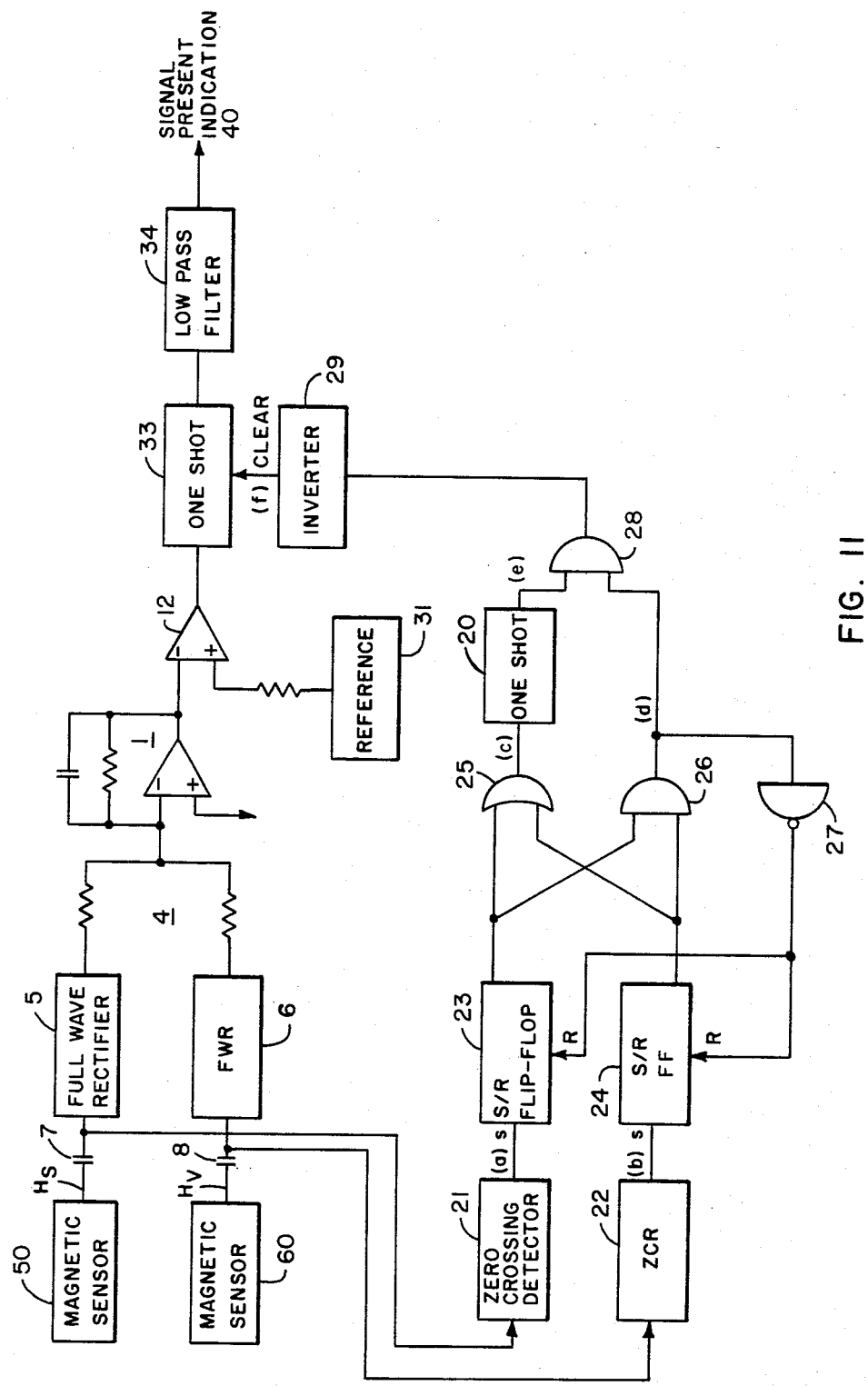
FIG. 11 is a block diagram showing a preferred embodiment of the present invention.

A preferred embodiment of this method is presented in FIG. 11, incorporating both the non-linear filter and the interference rejection logic. The near quadrature signals $H_v$ and $H_s$ from sensors 50 and 60 are ac coupled by capacitors 7 and 8 and then provided to both a non-linear filter and an interference rejection logic. The non-linear filter consists of two full wave rectifiers 5 and 6, a summer 4, and a low pass filter 1. A comparator 12 then triggers (if the filter output exceeds a preset reference 31) triggering a one-shot multivibrator 33. The one-shot output is filtered by low pass filter 34 to reject very quick set-clear operation of the one-shot should that occur under interference conditions. However, if the oneshot is allowed to time out, (complete its full time on cycle of operation) a signal present indication occurs at the output of the filter. FIG. 12 shows some of the power line reject waveforms of FIG. 11 with the input of FIG. 10.

The logic circuit accepts the two ac coupled input signals and provides a zero crossing detection 21 and 22 to each (such as two comparators in parallel; one sensing >0, the other <0, with outputs "OR"ed). The zero crossing detector outputs are respectively applied to set/reset flip-flops 23 and 24, to set them on each zero crossing. The "OR" gate 25 triggers the one-shot when either flip-flop is set. When the second flip-flop (either unit, second in time sequence) is set "AND" gate 26 and "NAND" gate 27 provide an immediate reset (reset occurs on low) of both flip-flops, delayed only by propagation through two gates. This propagation delay, however, is sufficient that the output AND gate 28 functions, providing the one-shot is still high (measure of time lag between zero crossings). If the one-shot is still high, the non-linear filter one-shot 33 is cleared by the zero level of the output inverter 29, inhibiting the "signal present" indication for large amplitude interference unless a quadrature signal is also present, as previously described. The clearing of one-shot 33 once each cycle of the interference signal causes a high frequency to be presented to low pass filter 34. Filter 34 will not pass this high frequency signal on to the output 40. Of course, if the non-linear filter circuit does not fire the one-shot 33 (due to its filtering operation on any signals present), then it matters not whether a signal is received from the interference rejection logic circuit.

Once a signal is passed by filter 34, it is sent to a detonator so as to destroy the target. In this way the system acts as a proximity device which is not tripped by normal time-variant signals but will be tripped by quadrature signals, either alone or in combination with the time variant signals.

We claim:

1. A target detector system comprising first and second sensors having first and second outputs respectively; first and second output signals appearing respectively on said outputs upon detection of the target; said first and second output signals having a near quadrature time relationship to each other; large unwanted ac interference output signals being periodically generated by said sensors; said interference output signals on the first and second outputs of said first and second sensors being in-phase or 180° out-of-phase with relationship to each other; first and second zero crossing detectors connected respectively to said first and second sensors for producing an output upon detecting a zero crossing of any signal from said sensors; a first circuit connected to the outputs of said first and second zero crossing detector; said first circuit having a first circuit output signal when said first and second zero crossing detectors have outputs which are simultaneous or are in a close time relationship to each other relative to the quadrature time relationship of the first and second output signals produced by the detection of a target; said first circuit not having a first circuit output signal when said zero crossing detectors have outputs which are delayed with respect to each other in a time relationship close to the quadrature time relationship; a non-linear filter connected to the outputs of said first and second sensors such that the interference output signal will be doubled in frequency while reducing the frequency of the first and second output signals having quadrature time relationship; a low pass filter connected to an output of said non-linear filter such that most of the unwanted interference output signals will be blocked from passing through said low pass filter; a second circuit connected to an output of said low pass filter, the output of said first circuit being connected to said second circuit such that said second circuit will not pass any signal from said low pass filter when said first circuit has an output signal; and said second circuit passing a signal from said low pass filter when said first circuit does not have an output signal; and said output of said second circuit being an indication of a detection of the target.

2. A detector system as set forth in claim 1 wherein said first circuit comprises first and second set/reset flip-flops having first and second set inputs connected respectively to outputs of said first and second zero crossing detectors; an OR gate having inputs connected to outputs of said flip-flops; a first AND gate having inputs connected to the outputs of said flip-flops; a delay device connected between an output of said first AND gate and the resets of said first and second flip-flops; a second AND gate having first and second inputs and an output; a first one-shot connected between the output of said OR gate and the first input of said second AND gate; the output of said first AND gate being connected to the second input of said second AND gate; and the output of said second AND gate being the output of said first circuit.

3. A detector system as set forth in claim 2 wherein said second circuit comprises a second one-shot having a trigger input, a clear input and an output; an inverter connected between the output of said second AND gate and the clear input of said second one-shot; the input of said second one-shot being connected to the output of said low pass filter; and the output of said second one-shot being connected to a second low pass filter such that no signal will be passed by said low pass filter if the second one-shot is cleared before its full time on cycle of operation is complete; and the output of the second low pass filter being the output of the second circuit.

4. A system as set forth in claim 3 wherein said non-linear filter comprises first and second non-filtered full wave rectifiers connected to the outputs of said first and second sensors; and a combining device connecting the outputs of said rectifiers to an input of the first mentioned low pass filter.

5. A target detector system comprising first and second sensors having first and second outputs respectively; first and second output signals appearing respectively on said outputs upon detection of the target; said first and second output signals having a near quadrature time relationship to each other; large unwanted ac interference output signals being periodically generated by said sensors; said interference output signals on the first and second outputs of said first and second sensors being in-phase or 180° out-of-phase with relationship to each other; first and second zero crossing detectors connected respectively to said first and second sensors for producing an output upon detecting a zero crossing of any signal from said sensors; a first circuit connected to the outputs of said first and second zero crossing detector; said first circuit having a first circuit output signal when said first and second zero crossing detectors have outputs which are simultaneous or are in a close time relationship to each other relative to the quadrature time relationship of the first and second output signals produced by the detection of a target; said first circuit not having a first circuit output signal when said zero crossing detectors have outputs which are delayed with respect to each other in a time relationship close to the quadrature time relationship; said first circuit comprises first and second set/reset flip-flops having first and second set inputs connected respectively to outputs of said first and second zero detectors; an OR gate having inputs connected to outputs of said flip-flops; a first AND gate having inputs connected to the outputs of said flip-flops; a delay connected between an output of said first AND gate and the resets of said first and second flip-flops; a second AND gate having first and second inputs and an output; a first one-shot connected between the output of said OR gate and the first input of said second AND gate; the output of said first AND gate being connected to the second input of said second AND gate; and the output of said second AND gate being the output of said first circuit.

* * * * *